United States Patent [19]

Canning et al.

[11] Patent Number: 4,731,344

[45] Date of Patent: Mar. 15, 1988

[54] METHOD OF MAKING A SINGLE HETEROSTRUCTURE LASER CHIP HAVING SAWN CAVITIES AND SECONDARY SAW CUTS

[75] Inventors: Kevin Canning; Alan J. Perryman, both of Paignton, Great Britain

[73] Assignee: STC Plc, London, England

[21] Appl. No.: 835,990

[22] Filed: Mar. 4, 1986

[30] Foreign Application Priority Data

Mar. 8, 1985 [GB] United Kingdom ................ 8506072

[51] Int. Cl.$^4$ .......................................... H01L 21/304
[52] U.S. Cl. .................................. 437/129; 437/225; 437/226; 437/249; 156/652; 156/656
[58] Field of Search ...................... 29/580, 583, 569 L; 372/44, 45, 46; 357/16, 17; 156/645; 83/856; 437/129, 229, 226, 249

[56] References Cited

U.S. PATENT DOCUMENTS

| | | | |
|---|---|---|---|
| 3,247,576 | 4/1966 | Dill et al. ............................. | 29/583 |
| 3,341,937 | 9/1967 | Dill, Jr. ............................. | 29/569 L |
| 4,011,113 | 3/1977 | Thompson et al. ................... | 29/580 |
| 4,066,482 | 1/1978 | Shaw .................................. | 148/175 |
| 4,093,345 | 6/1978 | Logan et al. .......................... | 372/45 |
| 4,128,815 | 12/1978 | Kawaguch et al. ................... | 372/45 |
| 4,138,304 | 2/1979 | Gantley .............................. | 156/268 |
| 4,573,163 | 2/1986 | Kaminow ............................. | 357/17 |
| 4,605,944 | 8/1986 | Ishii et al. ............................. | 357/17 |
| 4,610,079 | 9/1980 | Abe et al. ............................. | 29/580 |
| 4,615,032 | 9/1986 | Holbrook et al. ..................... | 357/17 |

FOREIGN PATENT DOCUMENTS 2090056 6/1982 United Kingdom ................. 357/17

Primary Examiner—Brian E. Hearn
Assistant Examiner—Kevin McAndrews
Attorney, Agent, or Firm—Lee, Smith & Zickert

[57] ABSTRACT

A sawn cavity single heterostructure laser chip is provided with secondary saw cuts to produce an inverted Tee shaped cross-section in order to limit the width of emission to less than the full width of the chip. The depth of the secondary cuts is arranged to terminate just short of the active region (3).

6 Claims, 2 Drawing Figures

METHOD OF MAKING A SINGLE HETEROSTRUCTURE LASER CHIP HAVING SAWN CAVITIES AND SECONDARY SAW CUTS

BACKGROUND OF THE INVENTION

This invention relates to single heterostructure sawn cavity injection laser chip manufacture, and is particularly concerned with the obtaining of relatively narrow width emission regions in such devices.

The chip of a single heterostructure laser is typically in the region of 120 microns thick. The length of the optical cavity is typically in the region of 400 microns long, and the reflecting facets that define this cavity length are obtained by cleaving. In a conventional sawn cavity laser the remaining dimension of the chip, the width, is determined by sawing through the material of the semiconductor slice to divide up a bar semiconductor material into individual chips. By this method chips can readily be prepared with widths down to about 80 microns. However, it becomes increasingly difficult to produce satisfactory lasers with widths thinner than this. One of the factors responsible for this difficulty is the fact that the sawing process produces microcracks in the residual material adjacent the saw cut. It follows therefore that, if two parallel saw cuts are made sufficiently close together, the material between them is rendered mechanically weak when the microcrack propagation from one saw cut approaches, or even worse becomes interleaved with, microcrack propagation from the other.

SUMMARY OF THE INVENTION

Accordingly it is a general object of the invention to avoid the disadvantages of the prior art.

More particularly, according to the present invention there is provided a method of making a sawn cavity laser chip, which method includes the steps of preparing a single heterostructure device structure single crystal semiconductor wafer by the epitaxial growth of a layer of GaAlAs of one conductivity type upon a GaAs substrate of the opposite conductivity type, cleaving the wafer to obtain a bar of semiconductor material sawing the bar into individual chips, and making secondary saw cuts parallel with the sawn edges to define a laser chip with an inverted Tee cross-section, wherein the secondary saw cuts are made to a depth terminating short of the active region of the laser chip defined by its heterostructure.

BRIEF DESCRIPTION OF THE DRAWINGS

There follows a description of the manufacture of a sawn cavity injection laser chip embodying the invention in a preferred form. This description refers to the accompanying drawings in which.

DETAILED DESCRIPTION OF THE PREFERRED EMBODIMENT

A (100) plane oriented wafer 1 of silicon doped n-type GaAs, typically about 240 to 320 microns thick, forms the substrate for the liquid phase epitaxial growth of a layer 2 typically about 150 to 200 microns thick of p-type GaAlAs. The dopant of the GaAlAs is zinc, and during the epitaxial growth some of this zinc diffuses into the substrate material to produce a shallow layer 3 of p-type GaAs, typically about 2 microns thick, which forms the active region of the device.

Figure 1:
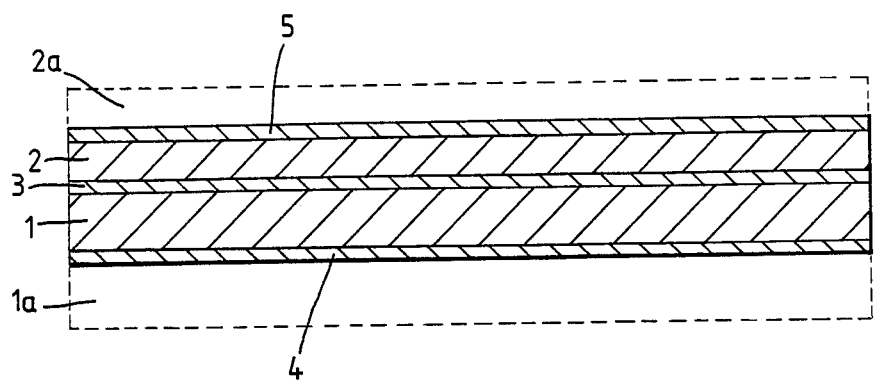
FIG. 1 depicts a schematic cross-section of a semiconductor wafer from which sawn cavity laser chips are prepared.
Figure 2:
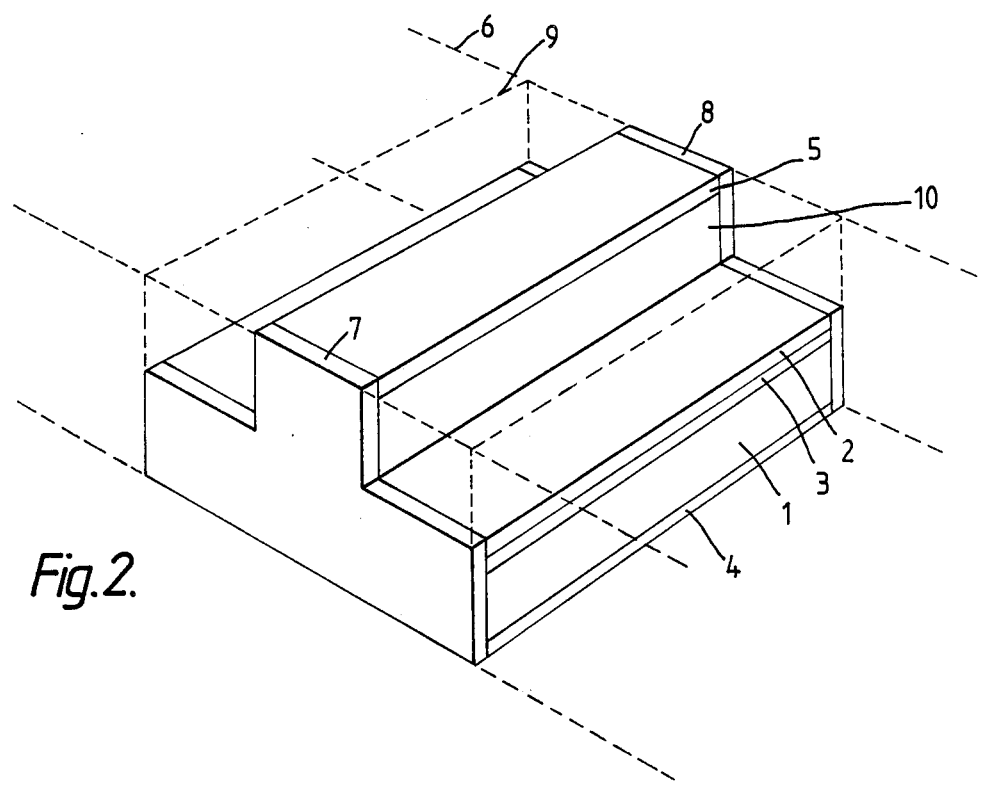
FIG. 2 depicts a schematic perspective view of a sawn cavity laser chip prepared from the wafer of FIG. 1.

Material 1a, 2a is next removed from both major surfaces of the wafer to reduce its thickness to about 100 to 120 microns before forming alloyed contacts 4 and 5 on those surfaces. Then the wafer is cleaved along (011) planes into bars 6 (FIG. 2) typically about 400 microns wide. The cleaved faces of a bar are then provided with facet coatings 7 and 8, one of which is a high reflective coating while the other is a reflection reducing coating. The bar is then waxed down on to a suitable supporting surface (not shown) for sawing the bar up with a diamond wheel into laser chips of cuboid shape indicated generally at 9.

Thus far the manufacture of the laser chip has proceeded according to conventional practice. The laser chip is in this particular instance required to have an emission width of approximately 40 microns and, as explained above, it has not been found practical to saw the strips into chips that are only 40 microns wide. This problem is overcome by spacing the initial saw cuts to provide the chip with a width of more than 80 microns, typically about 110 microns, and then to make secondary saw cuts parallel with the first, but at a closer spacing. These cuts are not full depth cuts, but are made to a depth terminating just short of the active region 3. The result is that the cross-section of the chip is converted from rectangular to that of an inverted Tee. The spacing of these secondary cuts is such as to make the stem of this Tee about 40 microns wide. Preferably the secondary cuts are made to a depth to leave not more than 10 microns of material above the active region. There is then very little current spreading above the active region under the root of the stem 10 of the Tee, and hence energisation of the active region is confined virtually exclusively to the region directly under the Tee's stem.

One convenient way of determining the depth of the active region in the thinned wafer, and hence also the determination of the depth to which the secondary cuts should be taken, is to take one of the laser chips from the wafer that have been created by the initial sawing operation, and to drive it with sufficiently high current to cause it to burn out. The resulting facet damage, which is clearly observable, is located where the active region meets the output facet.

After the secondary saw cuts have been made the alloyed contact 4 on the cross-bar portion of the Tee is bonded to a heat sink (not shown) by which one terminal connection to the laser chip is also made. The other terminal connection is made to the alloyed contact 5 by way of a flying lead (not shown).

We claim:

1. A method of making a sawn cavity laser chip, which method includes the steps of preparing a single heterostructure device structure single crystal semiconductor wafer by the epitaxial growth of a layer of GaAlAs of one conductivity type upon a GaAs substrate of the opposite conductivity type, cleaving the wafer to obtain a bar of semiconductor material sawing the bar into individual chips, and making secondary saw cuts parallel with the sawn edges to define a laser chip with an inverted Tee cross-section, wherein the secondary saw cuts are made to a depth terminating short of the active region of the laser chip defined by its heterostructure.

2. A method as claimed in claim 1, wherein the stem of the Tee is less than 80 microns in width and the cross-bar of the Tee is greater than 80 microns in width.

3. A method as claimed in claim 2, wherein the stem of the Tee is approximately 40 microns in width.

4. A method as claimed in claim 1, wherein the secondary saw cuts are made to a depth not more than 10 microns distant from the active region.

5. A method as claimed in claim 4, wherein the stem of the Tee is less than 80 microns in width and the cross-bar of the Tee is greater than 80 microns in width.

6. A method as claimed in claim 4, wherein the stem of the Tee is approximately 40 microns in width.

* * * * *